(12) United States Patent
Kurita

(10) Patent No.: US 7,034,386 B2
(45) Date of Patent: Apr. 25, 2006

(54) THIN PLANAR SEMICONDUCTOR DEVICE HAVING ELECTRODES ON BOTH SURFACES AND METHOD OF FABRICATING SAME

(75) Inventor: Yoichiro Kurita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/100,974

(22) Filed: Mar. 19, 2002

(65) Prior Publication Data

US 2002/0135057 A1   Sep. 26, 2002

(30) Foreign Application Priority Data

Mar. 26, 2001   (JP) .............................. 2001-086833

(51) Int. Cl.
*H01L 21/44*   (2006.01)

(52) U.S. Cl. ...................... 257/685; 257/687; 257/637

(58) Field of Classification Search ................ 257/685, 257/686, 690, 737, 778, 782; 438/108, 109, 438/613
See application file for complete search history.

(56) References Cited

U.S. PATENT DOCUMENTS 5,726,493 A * 3/1998 Yamashita et al. .......... 257/698
5,756,380 A * 5/1998 Berg et al. ................... 438/126
6,404,043 B1 * 6/2002 Isaak .......................... 257/686
6,489,676 B1 * 12/2002 Taniguchi et al. .......... 257/698

FOREIGN PATENT DOCUMENTS

| JP | 07-106509    | * | 4/1995  |
|----|--------------|---|---------|
| JP | 2000-124168  |   | 4/2000  |
| JP | 2000-243880  |   | 9/2000  |
| JP | 2000-332034  |   | 11/2000 |

* cited by examiner

*Primary Examiner*—Leonardo Andujar
(74) *Attorney, Agent, or Firm*—Katten Muchin Rosenman LLP

(57) ABSTRACT

A thin, planar semiconductor device having electrodes on both surfaces is disclosed. This semiconductor device is provided with an IC chip and a wiring layer having one side that is electrically connected to surface electrodes of the IC chip. On this surface of the wiring layer, conductive posts are provided on wiring of the wiring layer, and an insulating resin covers all portions not occupied by the IC chip and conductive posts. The end surfaces of the conductive posts are exposed from the insulating resin and are used as first planar electrodes. In addition, a resist layer is formed on the opposite surface of the wiring layer. Exposed portions are formed in the resist layer to expose desired wiring portions of the wiring layer. These exposed portions are used as second planar electrodes. Stacking semiconductor devices of this construction enables an improvement in the integration of semiconductor integrated circuits.

8 Claims, 3 Drawing Sheets

THIN PLANAR SEMICONDUCTOR DEVICE HAVING ELECTRODES ON BOTH SURFACES AND METHOD OF FABRICATING SAME

BACKGROUND OF THE INVENTION

1. Field of the Invention

The present invention relates to a semiconductor device and to a method of fabricating the semiconductor device, and in particular, to the construction of a semiconductor device that can be three-dimensionally stacked and to a method of fabricating the semiconductor device.

2. Description of the Related Art

With the rapid development of Internet technology, prior-art constructions such as mainframes and terminals that are connected to mainframes have been replaced by systems made up by servers that are distributed throughout the world and the high-speed communication lines that connect them.

This information communication network is now rapidly coming into popular use in households and by individuals through inexpensive and highly functional personal computers or mobile telephones that can be connected to the Internet, and as a result, the next-generation Internet protocol (IPv6) will allow connection of all types of electrical household appliances to the Internet. It is desirable that the LSI that is incorporated in these mobile telephones and information electrical appliances be capable, by itself, of various types of processing ranging from information processing and information saving to input/output control. SoC (System on Chip), in which various function blocks are formed on a single LSI chip to realize a high-level multi-functional information processing system, is now receiving increased attention. In actuality, however, the simultaneous formation of various function blocks requiring different forming processes on a silicon wafer is problematic both in terms of design as well as fabrication. There is the additional problem that such LSI lacks flexibility when specifications are to be modified, such as when modifying the design or extending the functionality of each block.

In recent years, SiP (System in Package), in which a plurality of separate LSI are integrated into a package and systemized, has shown great promise as a countermeasure to this problem. In particular, in a package in which each individual LSI is provided as a separate module and then stacked three-dimensionally, each module is first tested to ensure against defects before being integrated. As a result, a higher yield of products that are free of defects and a higher degree of integration through three-dimensional packaging can be obtained than for an SoC in which a large number of functional elements are formed simultaneously or an SiP in which non-modular chips are stacked.

SUMMARY OF THE INVENTION

It is an object of the present invention to provide a novel semiconductor device and a method of fabricating the semiconductor device that can provide a solution to the above-described problems of the prior art, and in particular, that enables an improvement in integration through three-dimensional packaging.

In the semiconductor device of the first aspect of the present invention, surface electrodes of an IC chip are electrically connected to one surface of a planar wiring layer that is constituted by electrical wiring. Further, conductive posts are provided on the wiring of the wiring layer on one surface of the wiring layer, and an insulating resin covers areas in which the IC chip and conductive posts are not provided. The end surfaces of the conductive posts are exposed from the insulating resin.

A resist layer is formed on the opposite surface of the wiring layer. Exposed portions in which desired wiring portions of the wiring layer are exposed are formed in this resist layer.

According to the first aspect of the present invention, the end surfaces of the conductive posts on one surface of the wiring layer can be used as first planar electrodes, and the exposed portions of the wiring on the other surface of the wiring layer can be used as second planar electrodes.

In the first aspect of the semiconductor device, first electrode terminals may be formed on the end surfaces of the conductive posts. Second electrode terminals may also be formed on the wiring in the exposed portions. Ball-shaped solder may be used for the first electrode terminals and for the second electrode terminals.

The method of fabricating the semiconductor device of the above-described first aspect involves the following steps of:

preparing a wiring substrate that is constituted by a base material and a wiring layer that is composed of wiring that is formed on this base material, and an IC chip having electrode terminals formed on its surface;

providing conductive posts on desired wiring of the wiring layer of the wiring substrate;

connecting the surface electrodes of the IC chip to desired wiring of the wiring layer of the wiring substrate;

covering the IC chip and the conductive posts that have been arranged on the surface of the wiring layer of the wiring substrate and conductive bumps with an insulating resin;

removing the base material from the wiring substrate to expose the wiring layer;

forming a resist layer on the exposed wiring layer with the exception of desired wiring portions; and grinding away the insulating resin to expose the end surfaces of the conductive posts.

The present invention thus can provide a stackable semiconductor device that lacks package material, thereby enabling a thin construction and a greater degree of freedom in design. The present invention therefore enables the realization of a high-capacity memory module or a System-in-Package.

As a second aspect, the present invention provides an assembled unit in which a plurality of semiconductor devices of the above-described first aspect is stacked. This assembled unit can be produced by electrically connecting the exposed portions of the wiring layer of one semiconductor device to the end surfaces of the conductive posts of another semiconductor device among the stacked semiconductor devices.

Finally, as a third aspect, the present invention provides a semiconductor device in which a planar wiring layer that is composed of wiring that is electrically connected to the end surfaces of conductive posts is provided in the semiconductor device of the first aspect. In this aspect, first electrode terminals may be formed on the wiring of the planar wiring layer that is made up by wiring that is electrically connected to the end surfaces of the conductive posts, and second electrode terminals may be formed on wiring of the exposed portions.

The above and other objects, features, and advantages of the present invention will become apparent from the following description with reference to the accompanying drawings, which illustrate examples of the present invention.

DETAILED DESCRIPTION OF THE PREFERRED EMBODIMENTS

Figure 1:
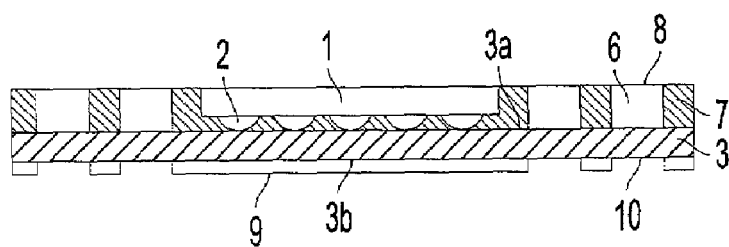
FIG. 1 is a sectional view of the semiconductor device according to the first embodiment of the present invention.

With the first working example of the semiconductor device of the present invention, referring to FIG. 1, IC chip 1 is arranged on one surface 3a of planar wiring layer 3. Wiring layer 3 is a layer composed of wiring such as signal lines, power supply lines, and ground lines. Electrodes 2 on the surface of IC chip 1 are electrically connected to desired wiring of wiring layer 3.

Wiring layer 3 is a structure in which a wiring substrate is formed by forming wiring on the surface of a planar base material, following which the base material is removed. IC chip 1 is a structure that has been made thin by grinding the rear surface.

On one surface 3a of wiring layer 3, protruding conductive posts 6 are electrically connected to the wiring that constitutes wiring layer 3. Although conductive posts 6 are formed as separate structures from the wiring of wiring layer 3 in this case, they may also be formed as a single unit with wiring layer 3. The height of conductive posts 6 is equal to the height of the rear surface of IC chip 1 that is arranged on the same surface 3a of wiring layer 3.

Still further, the vicinity of IC chip 1 and conductive posts 6 on this surface 3a of wiring layer 3 is covered with insulating resin 7. At least end surfaces 8 of conductive posts 6 are exposed from resin 7.

Solder resist layer 9 is formed on the opposite surface 3b of wiring layer 3. Exposed portions 10 for exposing desired wiring of the wiring that constitutes wiring layer 3 are formed in this solder resist layer 9. In other words, desired wiring portions on the opposite surface 3b of wiring layer 3 are not covered by solder resist layer 9.

According to the above-described construction, end surfaces 8 of conductive posts 6 on one surface 3a of wiring layer 3 can be used as first planar electrodes, and exposed portions 10 of wiring on the opposite surface 3b of wiring layer 3 can be used as the second planar electrodes.

In addition, ball-shaped solder may be affixed as electrode terminals to both or either of end surfaces 8 of conductive posts 6 and exposed portions 10 of the wiring of wiring layer 3 that are not covered by solder resist layer 9.

Explanation next regards the method of fabricating the above-described semiconductor device.

Figure 2A:
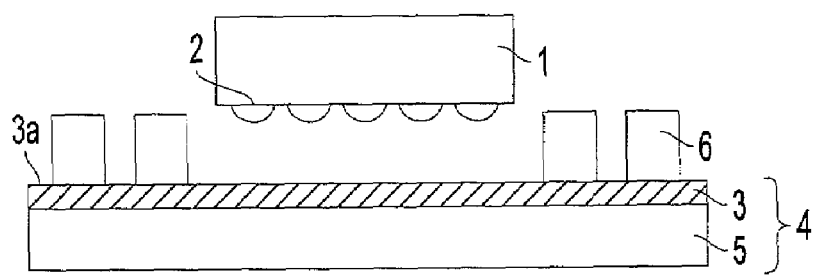
FIGS. 2A–2E show the fabrication steps of a semiconductor device according to the first embodiment example of the present invention.

First, as shown in FIG. 2A, wiring substrate 4 is prepared that is constituted by base material 5 and wiring layer 3 in which electrical wiring is formed such as signal lines, power supply lines, and ground lines. Conductive posts 6 are then provided on the wiring that constitutes wiring layer 3. IC chip 1 in which bumps are used on surface electrodes 2 is also prepared.

Figure 2B:
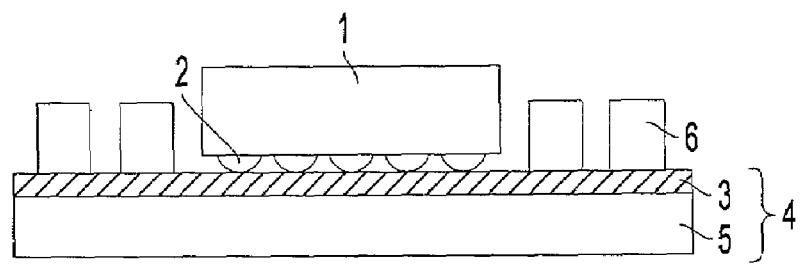

Next, as shown in FIG. 2B, surface electrodes 2 of IC chip 1 are electrically connected (flip-chip attachment (FCA)) to the wiring of wiring layer 3 on wiring substrate 4.

Figure 2C:
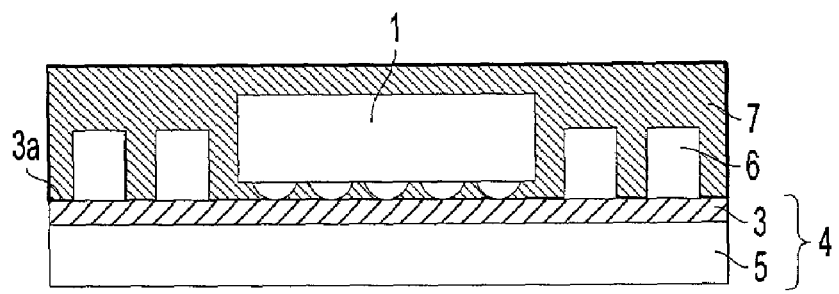

Insulating resin 7 as shown in FIG. 2C next covers IC chip 1 and conductive posts 6 on wiring substrate 4, and resin 7 is hardened.

Figure 2D:
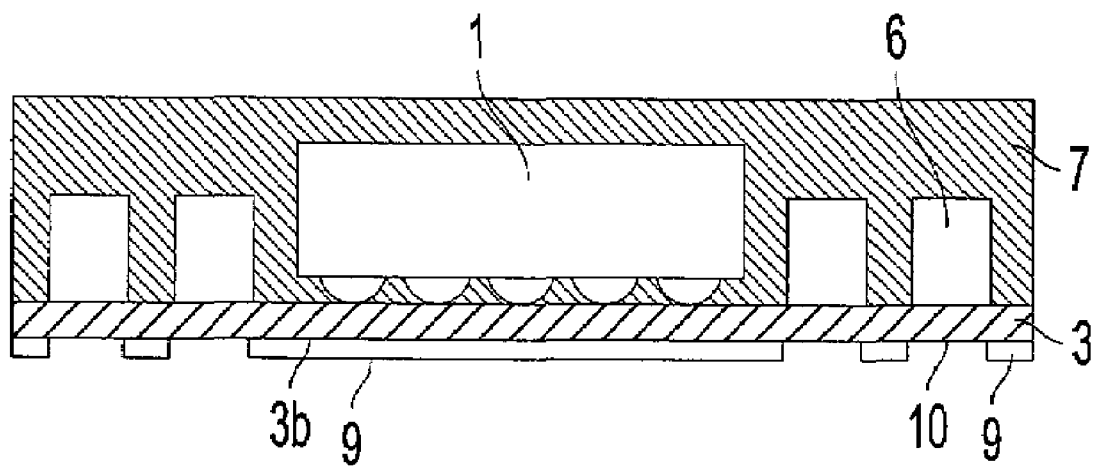

Base material 5 is next removed (Step a) from wiring substrate 4 to expose the opposite surface 3b that is on the opposite side of surface 3a of wiring layer 3, as shown in FIG. 2D. In addition, solder resist layer 9 is formed (Step b) on the opposite surface 3b of wiring layer 3 while leaving exposed portions 10 for exposing desired wiring of wiring layer 3. The film thickness of solder resist layer 9 is a maximum of 20 µm.

Figure 2E:
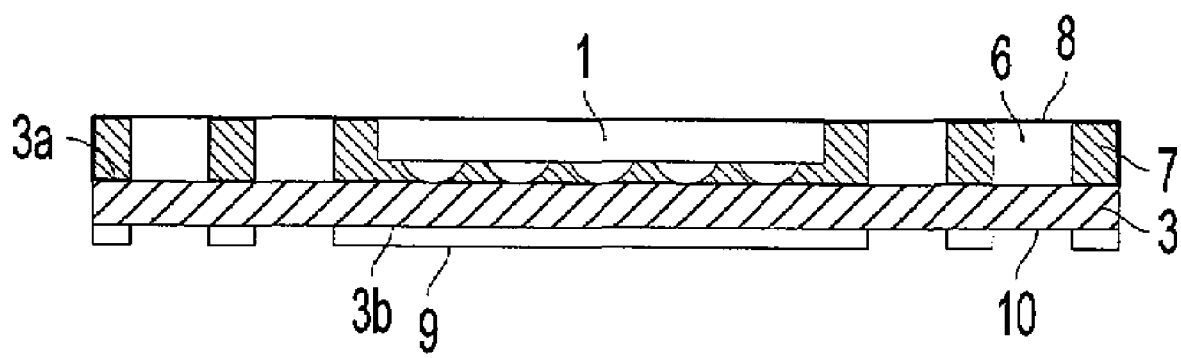

Resin 7, the rear surface of IC chip 1, and conductive posts 6 are next subjected to grinding to expose the end surfaces 8 of conductive posts 6, as shown in FIG. 2E (Step c).

The order of Step a, Step b, Step c is not limited to the order described hereinabove and may be determined as appropriate according to the manufacturing processes. The above-described procedure enables the formation of a thin planar semiconductor device that is shown in FIG. 1.

Explanation next regards the second embodiment example of the semiconductor device of the present invention.

Figure 3:
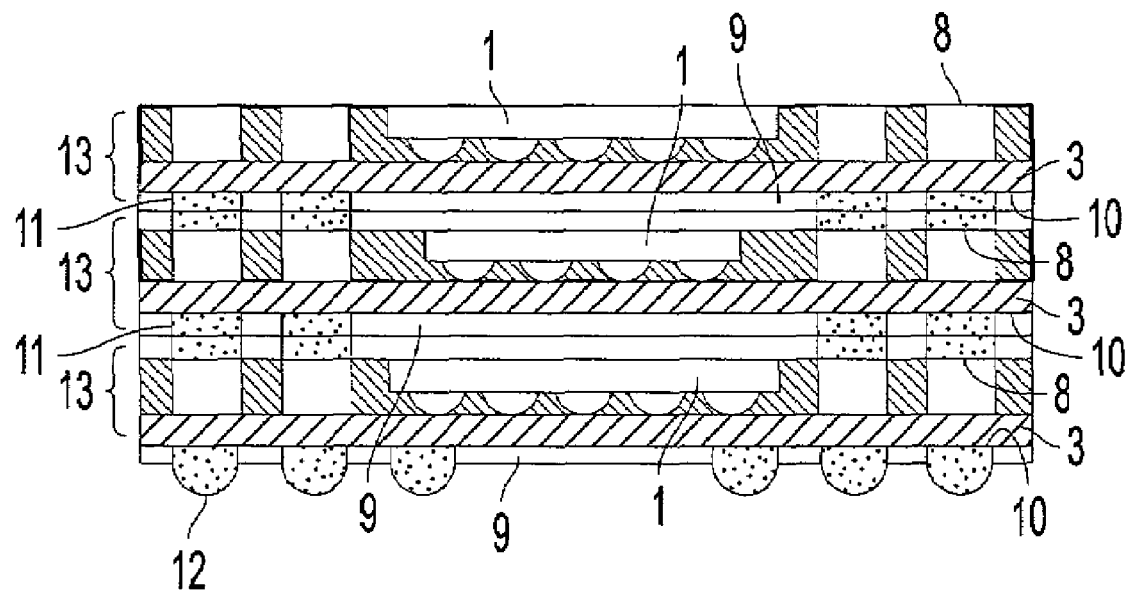
FIG. 3 shows the semiconductor device according to the second embodiment of the present invention.

The semiconductor device of the second embodiment that is shown in FIG. 3 is an assembled unit in which three of the semiconductor devices shown in FIG. 1 are stacked and electrically interconnected. Although there are three stacked layers in FIG. 3, the present invention is not limited to this number.

Referring now to FIG. 3, among vertically stacked semiconductor devices 13, exposed portions 10 of wiring layer 3 that are not covered by solder resist layer 9 of one semiconductor device 13 are connected by solder 11 to end surfaces 8 of conductive posts 6 that are provided on wiring layer 3 of another semiconductor device 13. In addition, ball-shaped solder 12 is affixed as electrode terminals to exposed portions 10 of wiring layer 3 that are not covered by solder resist layer 9 of lowermost semiconductor device 13.

Ball-shaped solder may also be affixed as electrode terminals to end surfaces 8 of conductive posts 6 of uppermost semiconductor device 13.

Stacking a plurality of layers of the semiconductor device shown in FIG. 1 to form an assembly as shown in FIG. 3 enables an improvement in the integration of semiconductor integrated circuits.

Explanation next regards the third embodiment of the semiconductor device of the present invention.

Figure 4:
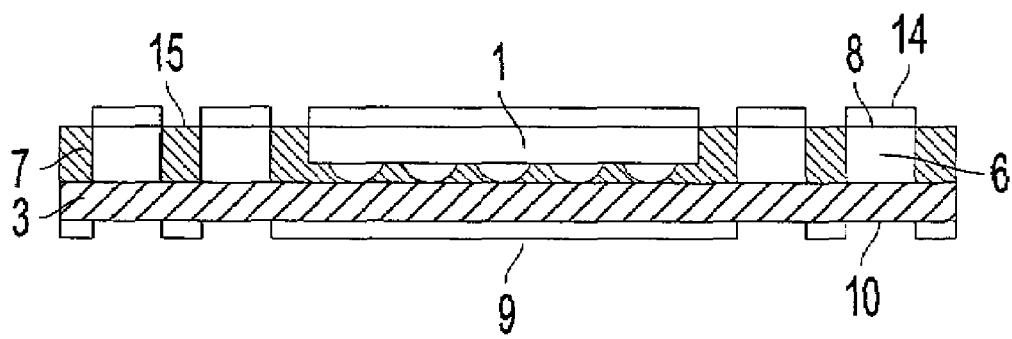
FIG. 4 shows the semiconductor device according to the third embodiment of the present invention.

The semiconductor device of the third embodiment that is shown in FIG. 4 is a structure in which planar wiring layer 14 made up by electrical wiring is provided on surface 15 that is on the opposite side from solder resist layer 9 of the semiconductor device shown in FIG. 1, this planar wiring layer 14 being electrically connected to end surfaces 8 of conductive posts 6.

In this construction, ball-shaped solder may be affixed as first electrode terminals to exposed portions 10 of the wiring of wiring layer 3 as shown in FIG. 3, and moreover, ball-shaped solder may be affixed as second electrode terminals to desired wiring of wiring layer 14. Of course, a construction is also possible in which second electrode terminals are not affixed to wiring layer 14.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:
a wiring layer including a first wiring, and said wiring layer having a first surface and a second surface opposing to said first surface, and said wiring layer having a solder resist layer provided on an exposed portion on said second surface;
an IC chip having an electrode on a front surface and mounted on said first surface to be electrically connected to said first wiring via said electrode by flip-chip bonding;
a conductive post provided on said first surface to be electrically connected to said first wiring;
insulating resin filling a space between said IC chip and said conductive post to form an upper surface opposite to said first surface and to expose a rear surface of said IC chip and an end surface of said conductive post;
wherein:
said rear surface and said end surface and said upper surface form a substantially flat and continuous surface.

2. The semiconductor device as claimed in claim 1, further comprising:
a second wiring on said second surface of said wiring layer.

3. The semiconductor device as claimed in claim 2, further comprising:
a third wiring formed on said upper surface to be electrically connected to said end surface.

4. The semiconductor device as claimed in claim 3, further comprising:
a solder ball formed between said end surface and said second wiring.

5. The semiconductor device as claimed in claim 2, further comprising:
a solder ball formed on said second wiring.

6. A semiconductor apparatus in which a plurality of semiconductor devices, according to claim 2, are stacked; wherein
an end surface of one of said plurality of semiconductor devices is electrically connected to a second wiring of another of said plurality of semiconductor devices.

7. The semiconductor device as claimed in claim 1, further comprising:
a third wiring formed on said upper surface to be electrically connected to said end surface.

8. The semiconductor device as claimed in claim 1, further comprising:
a solder ball formed on said end surface.

* * * * *